United States Patent
Herrmann

(10) Patent No.: US 10,734,179 B2
(45) Date of Patent: Aug. 4, 2020

(54) METHOD AND APPARATUS FOR CONTROLLING A CIRCUIT BREAKER IN AN ELECTRICAL ENERGY SUPPLY NETWORK

(71) Applicant: SIEMENS AKTIENGESELLSCHAFT, Munich (DE)

(72) Inventor: Hans-Joachim Herrmann, Markt Erlbach (DE)

(73) Assignee: Siemens Aktiengesellschaft, Munich (DE)

(*) Notice: Subject to any disclaimer, the term of this patent is extended or adjusted under 35 U.S.C. 154(b) by 277 days.

(21) Appl. No.: 15/697,657

(22) Filed: Sep. 7, 2017

(65) Prior Publication Data

US 2018/0082816 A1    Mar. 22, 2018

(30) Foreign Application Priority Data

Sep. 22, 2016  (EP) .................................... 16190142

(51) Int. Cl.
*H01H 71/12*    (2006.01)
*H01H 9/56*     (2006.01)
(Continued)

(52) U.S. Cl.
CPC ............ *H01H 71/125* (2013.01); *H01H 9/56* (2013.01); *H01H 33/027* (2013.01);
(Continued)

(58) Field of Classification Search
CPC ............. H01H 71/125; H01H 71/1081; H01H 71/128; H01H 71/36; H01H 71/48; H01H 71/70; H01H 9/56; H01H 2071/0285
See application file for complete search history.

(56) References Cited

U.S. PATENT DOCUMENTS 4,910,631 A * 3/1990 Murphy ................ H02H 3/093
361/96
5,804,991 A * 9/1998 Hu .......................... H01H 9/56
327/141
(Continued)

FOREIGN PATENT DOCUMENTS

CN    102882402 A      1/2013
DE    102011107721 A1  1/2013
(Continued)

OTHER PUBLICATIONS

Xingke Fang: "Fault and Monitoring of Breakers", Chapter 8, Intelligent High Voltage Breaker, pp. 249-250, China Electric Power Press 2002—Statement of Relevance.

*Primary Examiner* — Scott Bauer
(74) *Attorney, Agent, or Firm* — Laurence Greenberg; Werner Stemer; Ralph Locher

(57) ABSTRACT

A method and an apparatus for controlling a circuit breaker in an electrical energy supply network. A switching signal is generated by a protective or control device of the energy supply network and the switching signal is transmitted to a control unit of the circuit breaker. The control unit is caused to open the switching contacts of the circuit breaker upon reception of the switching signal. In order to ensure a switching operation which is as fast as possible even in those energy supply networks in which phases of the current to be switched by a circuit breaker which are free of zero crossings can occur, a current flowing through the circuit breaker is recorded and is checked for the occurrence of zero crossings. The transmission of the signal for opening the switching contacts is prevented until at least one zero crossing has been detected.

18 Claims, 6 Drawing Sheets

(51) Int. Cl.
  *H02H 3/02* (2006.01)
  *H02H 7/22* (2006.01)
  *H01H 33/02* (2006.01)
  *H01H 33/59* (2006.01)
  *H02H 3/08* (2006.01)
  *H01H 71/10* (2006.01)
  *H01H 71/36* (2006.01)
  *H01H 71/48* (2006.01)
  *H01H 71/70* (2006.01)
  *G01R 15/18* (2006.01)
  *G01R 19/175* (2006.01)
  *G01R 19/25* (2006.01)
  *H01H 71/02* (2006.01)

(52) U.S. Cl.
  CPC ........ *H01H 33/59* (2013.01); *H01H 71/1081* (2013.01); *H01H 71/128* (2013.01); *H01H 71/36* (2013.01); *H01H 71/48* (2013.01); *H01H 71/70* (2013.01); *H02H 3/021* (2013.01); *H02H 3/083* (2013.01); *H02H 7/222* (2013.01); *G01R 15/18* (2013.01); *G01R 19/175* (2013.01); *G01R 19/2506* (2013.01); *H01H 33/593* (2013.01); *H01H 2071/0285* (2013.01)

(56) References Cited

U.S. PATENT DOCUMENTS

| | | | |
|---|---|---|---|
| 7,489,122 B2 | 2/2009 | Jurisch | |
| 7,692,336 B2 | 4/2010 | Pilz et al. | |
| 8,786,991 B1 | 7/2014 | Torres | |
| 9,588,151 B2 | 3/2017 | Javora et al. | |
| 9,678,112 B2 | 6/2017 | Rathsmann | |
| 2008/0019063 A1* | 1/2008 | Muller | H01H 9/56 361/42 |
| 2013/0057998 A1* | 3/2013 | Li | H01H 9/56 361/187 |
| 2016/0301199 A1 | 10/2016 | Mori et al. | |

FOREIGN PATENT DOCUMENTS

| | | |
|---|---|---|
| EP | 1928007 A1 | 6/2008 |
| EP | 2618356 A1 | 7/2013 |
| WO | 03050831 A1 | 6/2003 |
| WO | 2005031374 A1 | 4/2005 |
| WO | 2015028062 A1 | 3/2015 |
| WO | 2015056326 A1 | 4/2015 |

* cited by examiner

FIG 3
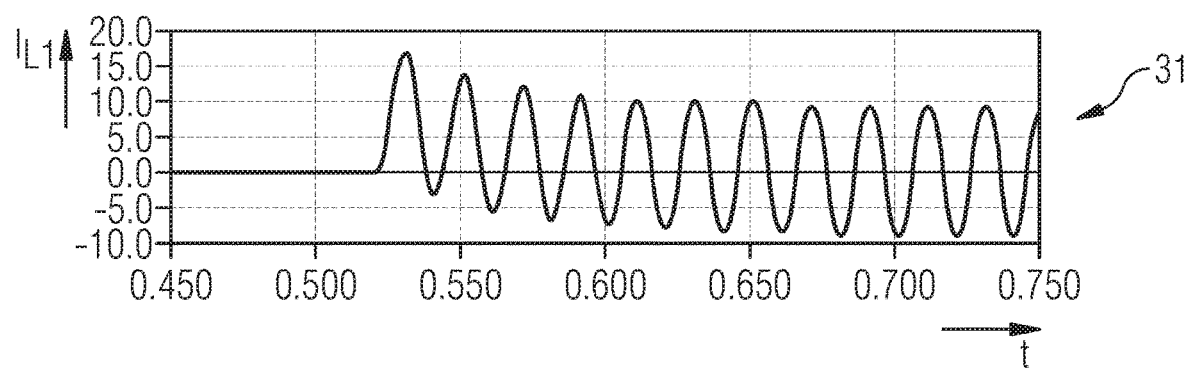
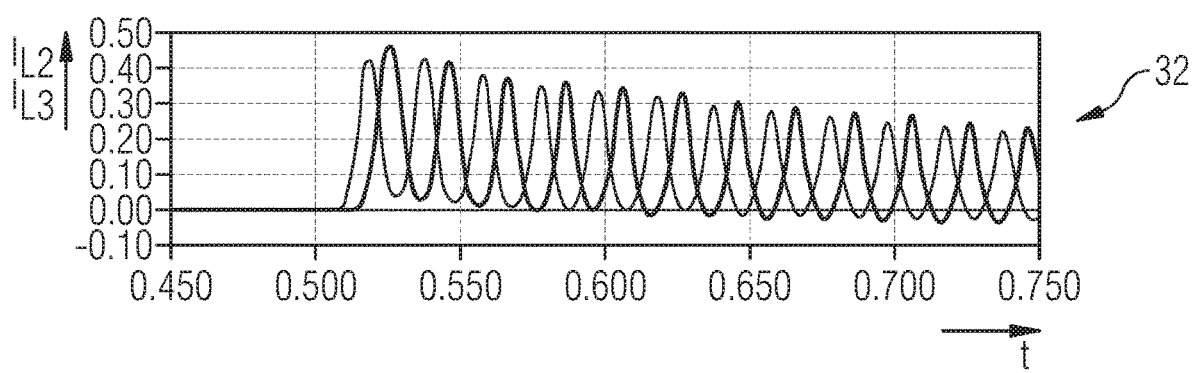

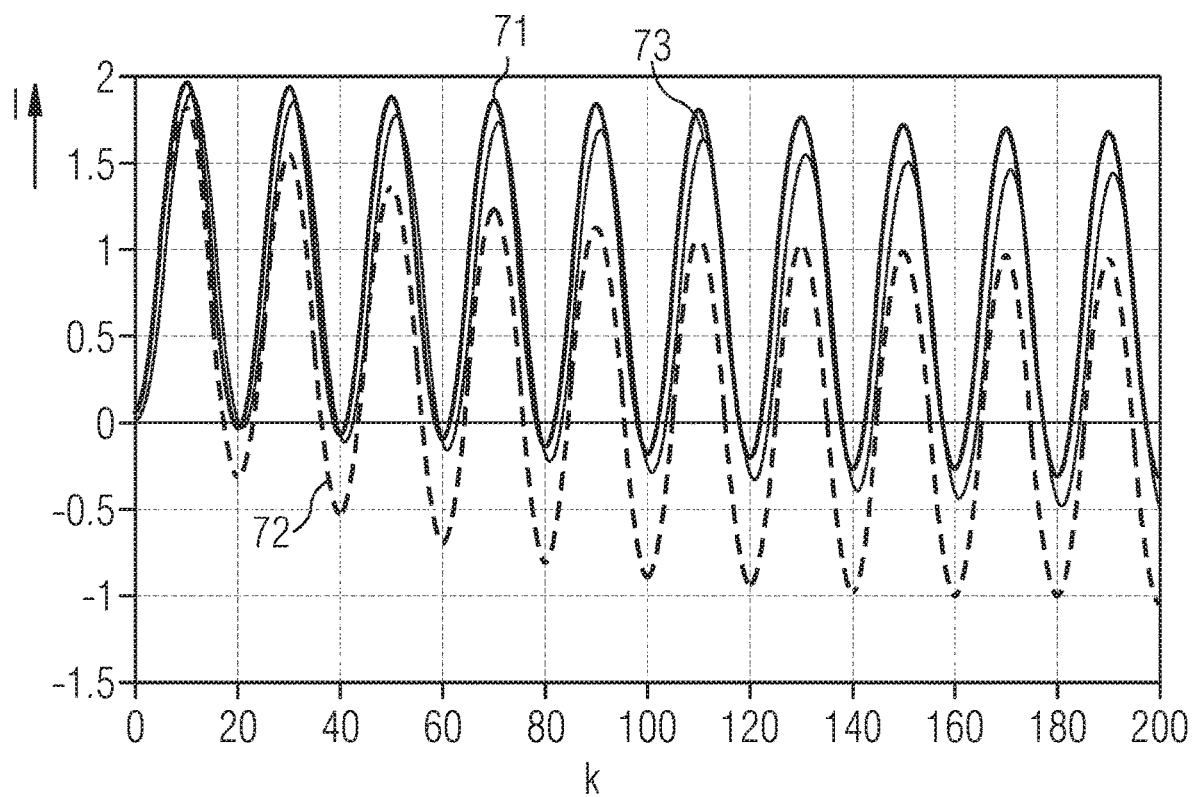

METHOD AND APPARATUS FOR CONTROLLING A CIRCUIT BREAKER IN AN ELECTRICAL ENERGY SUPPLY NETWORK

CROSS-REFERENCE TO RELATED APPLICATION

This application claims the benefit, under 35 U.S.C. § 119, of European patent application EP 16190142 filed Sep. 22, 2016; the prior application is herewith incorporated by reference in its entirety.

BACKGROUND OF THE INVENTION

Field of the Invention

The invention relates to a method for controlling a circuit breaker in an electrical energy supply network, in which a switching signal is generated by means of a protective or control device of the energy supply network and the switching signal is transmitted to a control unit of the circuit breaker, the control unit being caused to open the switching contacts of the circuit breaker upon reception of the switching signal.

The invention also relates to an apparatus for controlling a circuit breaker in an electrical energy supply network.

A method of the type as stated above is known, for example, from commonly assigned, published international patent application WO 2015/028062 A1. In the prior art method, if a fault has occurred in the energy supply network, a switching signal in the form of a fault signal is generated by way of a differential protective device and is transmitted to a circuit breaker so that the latter is caused to open its switching contacts.

During switch-on operations or in the event of faults, for example short circuits, in the energy supply network, the situation may arise under certain conditions in which the current to be interrupted using the circuit breaker has a high DC component. This effect is observed, in particular, in energy supply networks having a large inductive component, as caused by inductor coils, for example.

In the case of unfavorable switching or fault occurrence states or network parameters (for example in the case of large network time constants, for example in the case of a large inductive component in relation to the resistive component), it is possible for the current flowing through the circuit breaker to temporarily no longer have any zero crossings on account of the DC element.

This can have a critical effect, in particular, because a circuit breaker can only suppress a switching arc, which is usually produced during switch-off, when a current zero crossing is present. The actual switching operation takes place, in principle, at the current zero crossing. If a zero crossing is absent, the switching arc continues to burn and, in the worst-case scenario, may destroy the circuit breaker.

It is therefore conventional practice to use dynamic network calculations to analyze whether the effect described above can occur. Suitable simulation calculations are used to determine the most unfavorable conditions under which a current with absent zero crossings can occur. This results in the maximum theoretically possible time for which the current is free of zero crossings. In order to exclude damage to the circuit breaker by a switching operation during a phase without zero crossings, the switching signal is accordingly delayed. The time to be set is determined from the simulation calculations plus a safety margin. The disadvantage of this procedure is that the time delay is applied, in principle, to all switching signals, with the result that the circuit breaker is switched off only with the delay which has been set. However, this contradicts the fundamental philosophy of network protection, according to which the spread of damage, after a fault has occurred, should be limited by a fault switch-off which is as fast as possible. In addition, so-called "grid codes" (specifications for operating an energy supply network) require certain fault clearing times, in particular in order to ensure the network stability.

BRIEF SUMMARY OF THE INVENTION

It is accordingly an object of the invention to provide a method and device which overcome the above-mentioned and other disadvantages of the heretofore-known devices and methods of this general type and which ensure that a switching operation is as fast as possible even in those energy supply networks in which phases of the current to be switched by a circuit breaker can occur which are free of zero crossings.

With the foregoing and other objects in view there is provided, in accordance with the invention, a method for controlling a circuit breaker in an electrical energy supply network, the method comprising:

generating a switching signal by way of a protective or control device of the energy supply network;

monitoring a current flowing through the circuit breaker and checking the current for an occurrence of zero crossings; and transmitting the switching signal to a control unit of the circuit breaker only after at least one zero crossing has been detected, the switching signal causing the control unit to open switching contacts of the circuit breaker.

In order to achieve the above-noted objects, a method of the type stated at the outset is proposed, in which a current flowing through the circuit breaker is recorded and is checked for the occurrence of zero crossings, and the forwarding of the switching signal to the control unit is prevented until at least one zero crossing has been detected.

In the solution according to the invention, it can be ensured that the switching signal is applied to the control unit of the circuit breaker as quickly as the instantaneous state of the energy supply network allows. The control unit comprises, on the one hand, the drive of the circuit breaker and, on the other hand, a switch control device which, after receiving the switching signal, determines the optimum switching time of the circuit breaker, for example, and accordingly controls the drive.

For this purpose, the current flowing through the circuit current breaker is examined for current zero crossings. As soon as these are present, the switching signal is forwarded to the control unit of the circuit breaker. It is therefore not necessary to wait for expiry of a permanently set delay time before the switching signal is forwarded, with the result that the switching signal is forwarded immediately when zero crossings are present and safe switching of the circuit breaker is therefore ensured.

The method can be carried out separately for each switch-off circuit in a multi-phase energy supply network, for example in the three-phase system.

One advantageous embodiment of the method according to the invention provides for a section of the energy supply network which is limited by the circuit breaker to be monitored for the occurrence of a fault by means of the protective or control device, and for the switching signal to be generated by the protective device if a fault is detected with respect to the section.

In this embodiment, the switching signal is generated on account of protective monitoring of the section in question with regard to any faults, for example short circuits.

For the purpose of monitoring primary components (for example cables, lines, transformers etc.) of electrical energy supply networks, use is made of so-called protective or control devices in order to detect impermissible operating states of the respectively monitored primary component, which may be caused by short circuits or short circuits to ground, for example, and to automatically switch off said component. For this purpose, the protective or control device usually records, at one or more measurement points in the energy supply network, measurement variables, for example in the form of current and/or voltage measured values which characterize the operating state of the primary component. In order to perform its protective function, the device then evaluates the measurement variables while executing a so-called protection algorithm, that is to say a calculation and/or logic combination rule for evaluating the recorded measurement variables, and possibly generates a fault signal on the basis of the result of the evaluation, which fault signal causes a circuit breaker connected to the device to open its switching contacts in order to disconnect the faulty section from the remaining energy supply network.

Examples of protection algorithms frequently used to monitor energy supply networks are the distance protection method, the differential protection method or the over current protection method. These and other protection methods are sufficiently well known to a person skilled in the art and are therefore not dealt with here in depth.

As an alternative to a switching signal which is generated on account of protective monitoring, provision may also be made for the switching signal to be generated by means of the protective or control device upon reception of an external switch-off command.

In this case, the external switch-off command may be initiated, for example, either by means of a manual switching action by the operating personnel of the energy supply network or by means of a corresponding control signal from a control room.

In this context, another advantageous embodiment of the method according to the invention provides for a zero crossing to be detected for each period duration of the current flowing through the circuit breaker when a change in the sign of the current is detected.

This makes it possible to detect a current zero crossing very easily, namely by merely considering the sign of the current flowing through the circuit breaker.

Another advantageous embodiment of the method according to the invention may provide for a release signal to be generated by means of the protective or control device if at least one zero crossing has been detected with regard to the current flowing through the circuit breaker, and for the switching signal to be forwarded to the control unit when both the switching signal and the release signal are present.

This makes it possible to release the forwarding of the switching signal in a particularly simple manner in terms of circuitry since only a simple logic combination of the switching signal with the release signal, for example using an AND element, has to be carried out for this purpose. If both signals are present at the same time, the switching signal is forwarded to the control unit of the circuit breaker.

In this context, one advantageous development of the method according to the invention may additionally provide for the release signal to be generated cyclically for each period duration of the current flowing through the circuit breaker.

In this manner, the release signal is continuously adapted to the respectively existing network conditions. For example, cyclically checking the prerequisites of the release signal makes it possible to ensure that the release signal is withdrawn again if zero crossings are absent again after an already detected zero crossing.

Specifically, within the scope of the invention, provision may also be made for the frequency of the current flowing through the circuit breaker to be determined in order to determine the period duration of the current.

The frequency can be determined according to a conventional frequency measurement method. The period duration can be easily determined with knowledge of the frequency.

Another advantageous embodiment of the method according to the invention may also provide for forwarding of the switching signal to the control unit to be prevented until at least a predefined number of zero crossings has been detected.

In this embodiment, it can be ensured that the switching signal is not already forwarded to the control unit for an individual detected zero crossing, but rather a certain number of zero crossings must have occurred before the switching signal is forwarded. This makes it possible to increase the robustness of the method with respect to measurement errors and inaccuracies.

Another advantageous embodiment of the method according to the invention may also provide for the switching signal to be forwarded to the control unit independently of the presence of zero crossings with regard to the current flowing through the circuit breaker if a predefined period has expired since the generation of the switching signal.

This makes it possible to ensure that the switching signal is forwarded in any case to the control unit after the expiry of a maximum tolerable time, with the result that a maximum period before carrying out the switching operation is not exceeded.

Since, as explained, DC elements, in particular, are a significant cause of the freedom from zero crossings, the transmission of the DC element by the current transformers must be taken into account in the measurement method. This is necessary, in particular, in the case of current transformers having a small current transformer time constant since they virtually filter out the aperiodic DC element. In this case, there is scarcely a DC element in the current output by the current transformer on the secondary side and a current having zero crossings is therefore simulated.

Therefore, another advantageous embodiment of the method according to the invention proposes that the current flowing through the circuit breaker is recorded using a current transformer, and the current profile output by the current transformer on the secondary side is subjected to a correction in order to model a DC element, contained in the current present on the primary side, on the secondary side.

Specifically for this purpose, provision may be made for a digital filter to be used to correct the current profile output by the current transformer on the secondary side, the coefficients of which filter are formed on the basis of the current transformer type and/or a time constant of the current transformer.

These details make it possible to reliably correct the current output on the secondary side.

Another advantageous embodiment of the method according to the invention provides for the current flowing through the circuit breaker to be checked for the occurrence of zero crossings in the protective or control device.

As a result, the check in order to determine whether the switching signal can be forwarded can be advantageously carried out in the same device which also generates the switching signal.

However, as an alternative to this, provision may also be made for the current flowing through the circuit breaker to be checked for the occurrence of zero crossings in an apparatus which is arranged downstream of the protective or control device and is arranged upstream of the circuit breaker.

In this case, the check in order to determine whether the switching signal can be forwarded is carried out using a separate apparatus.

The above-mentioned object is also achieved by means of an apparatus for controlling a circuit breaker in an electrical energy supply network.

According to the invention, a signal input for receiving a switching signal generated by means of a protective or control device of the energy supply network and a signal output for outputting the switching signal to a control unit of the circuit breaker are provided. Provision is also made for the apparatus to be designed to check a current flowing through the circuit breaker for the occurrence of zero crossings and to prevent forwarding of the switching signal to the control unit until at least one zero crossing has been detected.

With regard to the apparatus according to the invention, all statements made above and below with respect to the method according to the invention and vice versa accordingly apply; in particular, the apparatus according to the invention is set up to carry out the method according to the invention in any desired embodiment or in a combination of any desired embodiments. With respect to the advantages of the apparatus according to the invention as well, reference is made to the advantages described with respect to the method according to the invention.

Specifically, with respect to the apparatus according to the invention, provision may be made for the apparatus to be integrated in the protective or control device or to be in the form of an apparatus separate from the protective or control device.

Other features which are considered as characteristic for the invention are set forth in the appended claims.

The invention is explained in more detail below using an exemplary embodiment. The specific configuration of the exemplary embodiment should not be understood as being restrictive in any way for the general configuration of the method according to the invention and of the apparatus according to the invention; rather, individual configuration features of the exemplary embodiment can be freely combined with one another and with the features described above in any desired manner.

The construction and method of operation of the invention, together with additional objects and advantages thereof will be best understood from the following description of specific embodiments when read in connection with the accompanying drawings.

BRIEF DESCRIPTION OF THE SEVERAL VIEWS OF THE DRAWING

FIG. 3 shows graphs having exemplary current profiles during a single-phase fault;

FIG. 7 shows a graph having profiles of the primary current and of the secondary current of a current transformer and of a corrected secondary current.

DETAILED DESCRIPTION OF THE INVENTION

Figure 1:
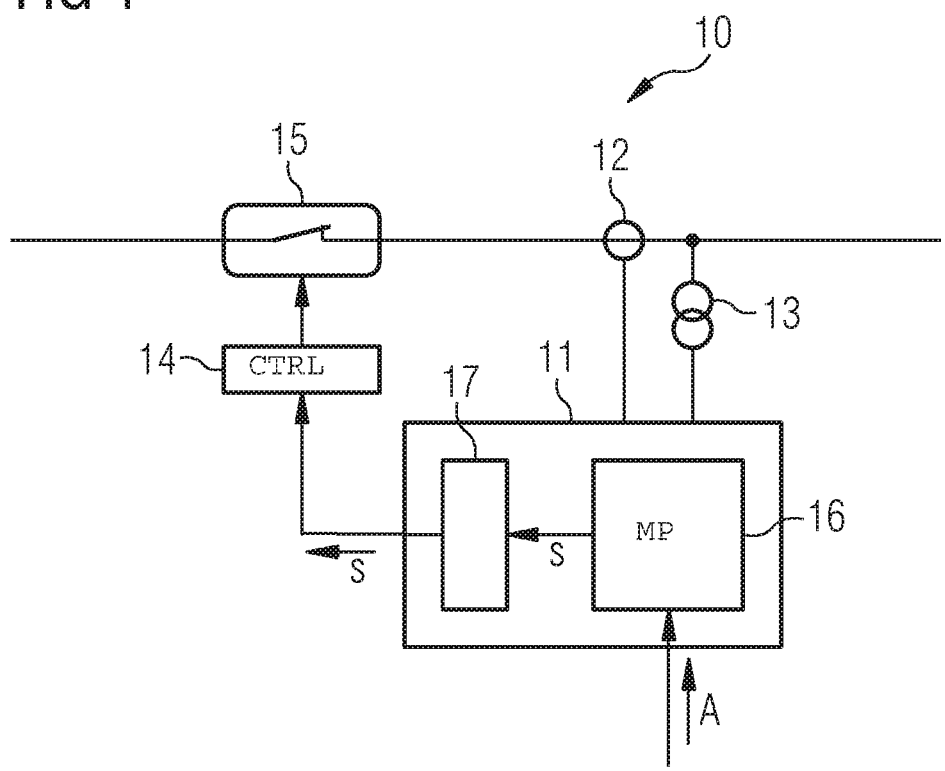
FIG. 1 shows a schematic view of a section of an electrical energy supply network which is monitored by means of a protective or control device.

Referring now to the figures of the drawing in detail and first, particularly, to FIG. 1 thereof, there is shown a section 10 of an electrical energy supply network. The section 10 may be a line of the energy supply network, for example. Instead, however, the section 10 may also comprise other primary components (transformers, generators, etc.) or a combination thereof of the energy supply network.

The section 10 is monitored for the occurrence of faults, for example short circuits, by a protective or control device 11. For this purpose, measured values which indicate the current flowing through the section 10 or the voltage applied to the section 10 are recorded by way of a current transformer 12 and a voltage transformer 13. By means of the protective or control device 11, the recorded measured values are then checked by computing device 16 (for example an accordingly programmed microprocessor μP) using so-called protection algorithms (for example distance protection algorithm, differential protection algorithm, overcurrent protection algorithm etc.) in order to determine whether they indicate a fault that is present in the section 10 being monitored. If a fault has been detected, the computing device 16 of the protective or control device generates a switching signal S which is forwarded to a control unit 14 (CTRL) assigned to a circuit breaker 15. The control unit 14 comprises a switch drive for moving at least one switching contact of the circuit breaker and a switch control device which implements the switching signal S in a suitable manner in order to control the circuit breaker, for example by determining an optimum switching time in order to open the circuit breaker as close as possible to a current zero crossing of the current flowing through the circuit breaker. Furthermore, the switch control device can also be used to carry out restart functions of the circuit breaker and other switch functions.

Although the section 10 is illustrated in FIG. 1 in the form of a single-phase system for the sake of simplicity, the method described below for controlling a circuit breaker can likewise be used in multi-phase systems, in particular in three-phase systems.

Switching operations and faults in energy supply networks having a significant proportion of inductances may result in DC elements being temporarily superimposed on the current flowing through the circuit breaker 15. This effect exists, in particular, in energy supply networks having large time constants (L/R), that is to say with a resistive component which is small in comparison with the inductive component. Depending on the switching state or on the occurrence of faults, the current profiles may be formed in this case in such a manner that no current zero crossings occur.

Alternating current (AC) circuits may, in principle, be controlled without any problems by means of a circuit breaker if the current has zero crossings. The circuit breaker interrupts the circuit at the zero crossing. If, however, the current zero crossing is absent, the arc which occurs during the switch-off operation can no longer be suppressed and the circuit breaker is thermally overloaded. The possibility of the destruction of the circuit breaker cannot be excluded.

Figure 2:
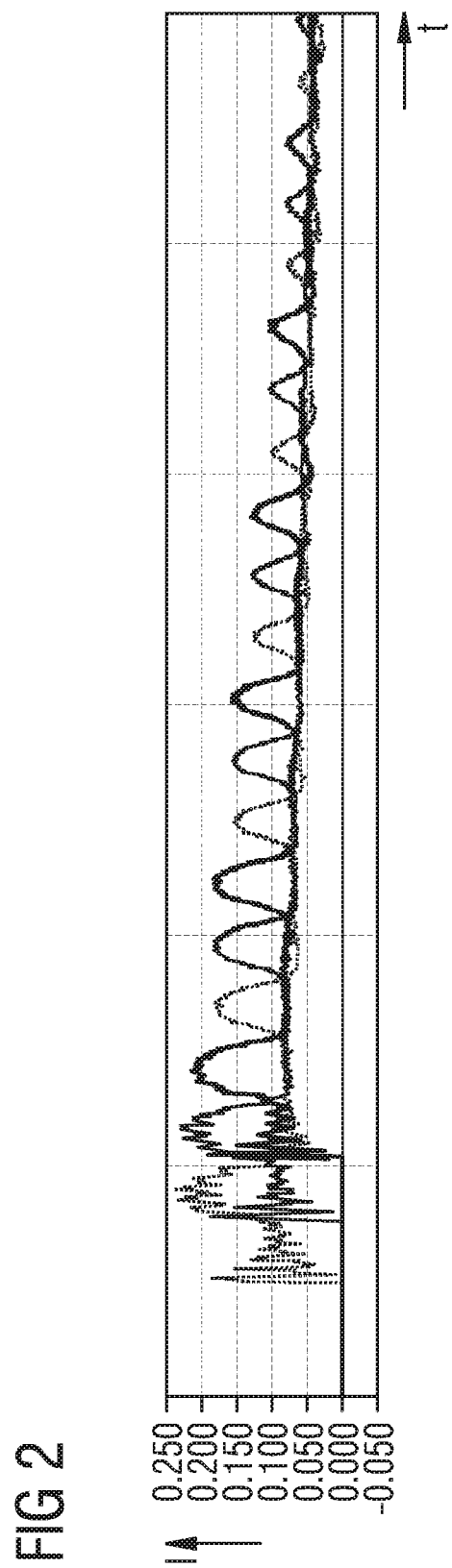
FIG. 2 shows a graph having exemplary current profiles during a switch-on operation.

FIG. 2 shows a graph having profiles of phase currents, in which this effect is illustrated during a switch-on operation of an underwater cable. The underwater cable is compensated by means of inductors and thereby has a significant proportion of inductances. On account of the large inductances, the known switch-on operation occurs, in which the result is large DC time constants and therefore the freedom from zero crossings. It is seen in FIG. 2 that no zero crossing occurs until the end of the plotted period.

FIG. 3 shows, by way of example, the profile of the phase currents during a single-phase short circuit to ground. The faulty phase L1 is shown in the upper graph 31, whereas the phases L2 and L3 which are not affected by the fault are illustrated in the lower graph. The fault current of the phase L1 shows the typical short-circuit current profile with a superimposed DC element. A shift to the two fault-free conductors L2, L3 now occurs as a result of the installation configuration. These conductors do not have any zero crossings for a certain time after the fault occurs.

Figure 4:
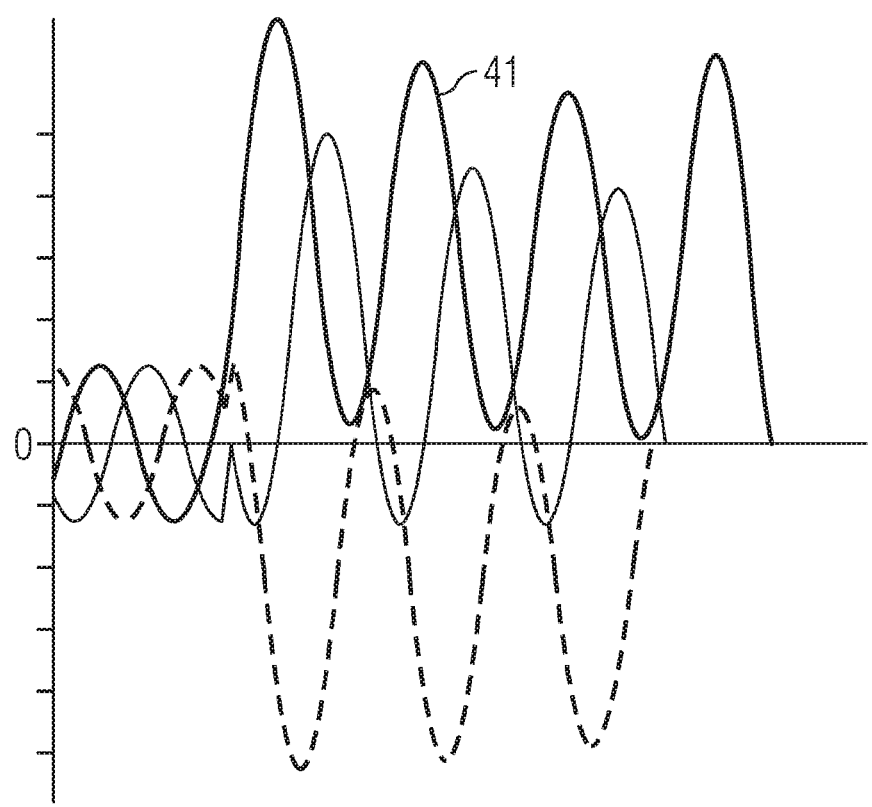
FIG. 4 shows a graph having exemplary current profiles during a three-phase fault.

FIG. 4 shows another example of a fault in which no current zero crossings temporarily occur. The graph illustrated in FIG. 4 shows the situation in which a three-pole short circuit does not simultaneously occur in all phases. A two-pole short circuit (therefore maximum DC element) occurs at the voltage zero crossing of the line-to-line voltage and subsequently changes to a three-pole short circuit after a quarter of a period. The phase indicated with the reference symbol 41 in FIG. 4 temporarily has no zero crossings in this case.

In order to also be able to safely interrupt the current using the circuit breaker in situations in which one or more phase currents do not have any zero crossings, a generated switching signal S is not directly forwarded to the control unit 14 (cf. FIG. 1) of the circuit breaker 15. Rather, the current flowing through the circuit breaker, for example in the form of the current output by the current transformer 12 on the secondary side, is recorded, sampled and examined for the occurrence of zero crossings by way of an apparatus 17 for controlling the circuit breaker 15. Alternatively, it is also possible to use a separate current transformer for the purpose of detecting zero crossings. A zero crossing may be detected, for example, on the basis of a change in the sign occurring between two successive measured values. Only when at least one zero crossing has been detected is the pending switching signal S forwarded from the apparatus 17 to the control unit 14 of the circuit breaker 15. Provision may also be made for a minimum number of zero crossings to have been detected before the switching signal S is forwarded to the control unit 14 of the circuit breaker 15. As a result, the method may be designed to be relatively robust with regard to measurement inaccuracies.

The protective or control device 11 may also be designed in such a manner that it generates a switching signal S when it receives an external switch-off command A. This external switch-off command A may be generated by a network control system in a network control station, for example, and may be transmitted to the protective or control device 11. Alternatively, an external switch-off command A may also be input using a manual input on an operating unit of the protective or control device 11.

In the exemplary embodiment in FIG. 1, the apparatus 17 is integrated in the protective or control device 11. Alternatively, however, the apparatus may also be a separate apparatus (not illustrated in FIG. 1) which is arranged downstream of the protective or control device 11 and is arranged upstream of the control unit 14, i.e., between the control device 11 and the switch control unit 14.

Specifically, provision may be made, for example, for the apparatus 17 to generate a release signal when at least one zero crossing has been detected in the current flowing through the circuit breaker 15. If both the release signal and the switching signal S are present at the same time, the switching signal is forwarded to the control unit 14 of the circuit breaker 15.

The current profiles illustrated in FIGS. 2 to 4 each show the current present on the primary side of the current transformer 12. The secondary current processed by the protective or control device 11 or the apparatus 17 is not modeled exactly by the current transformer. This is because a current transformer usually has properties of a high-pass element and therefore significantly influences the transmission of the DC element. The smaller the current transformer time constant, the higher the cut-off frequency. The DC element is therefore suppressed to a greater extent. Linear core transformers (TPZ transformers) are a typical representative of this case.

Figure 5:
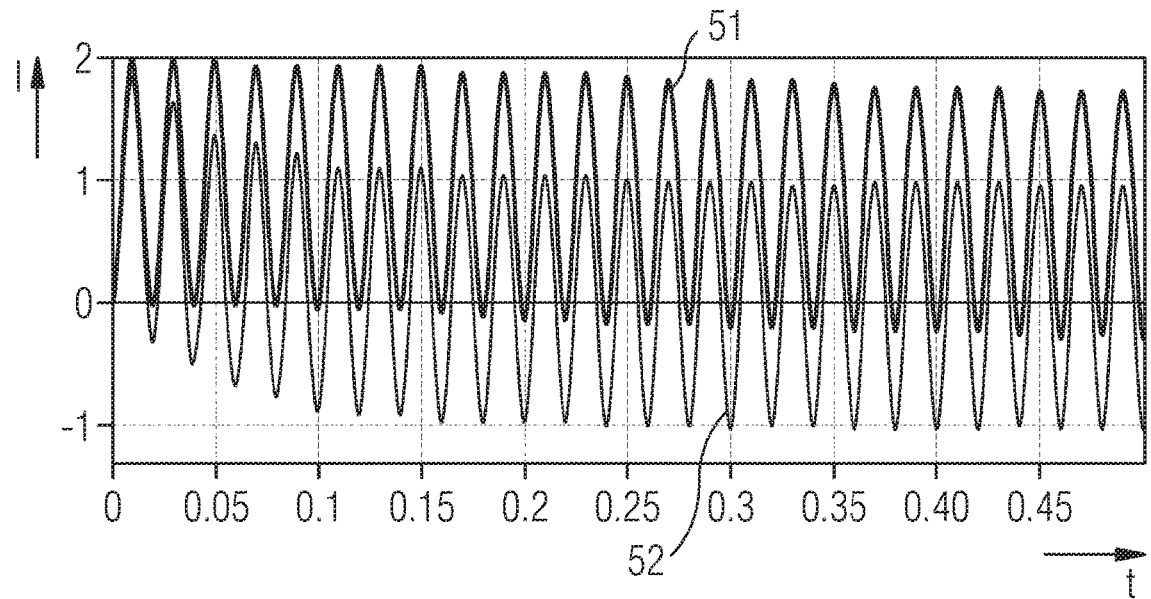
FIG. 5 shows a graph having profiles of the primary current and of the secondary current of a current transformer having a small current transformer time constant.

FIG. 5 shows the transmission behavior of a current transformer with respect to a current having a DC element. It is seen that the current profile 52 of the secondary current with respect to the DC element is transmitted in a distorted manner in comparison with the current profile 51 of the primary current.

A critical situation exists in extreme conditions in which a large network time constant (for example during a switch-on operation, so-called "in-rush") in the seconds range coincides with the transmission by a linear core transformer (small transformer time constant). As a result of the distorted transmission of the DC element, zero crossings can be seen in the secondary current profile, which zero crossings do not have an equivalent on the primary current side. For this reason, it is necessary in some cases to correct the current output by the current transformer 12 on the secondary side in order to carry out the method explained above for controlling the circuit breaker.

Figure 6:
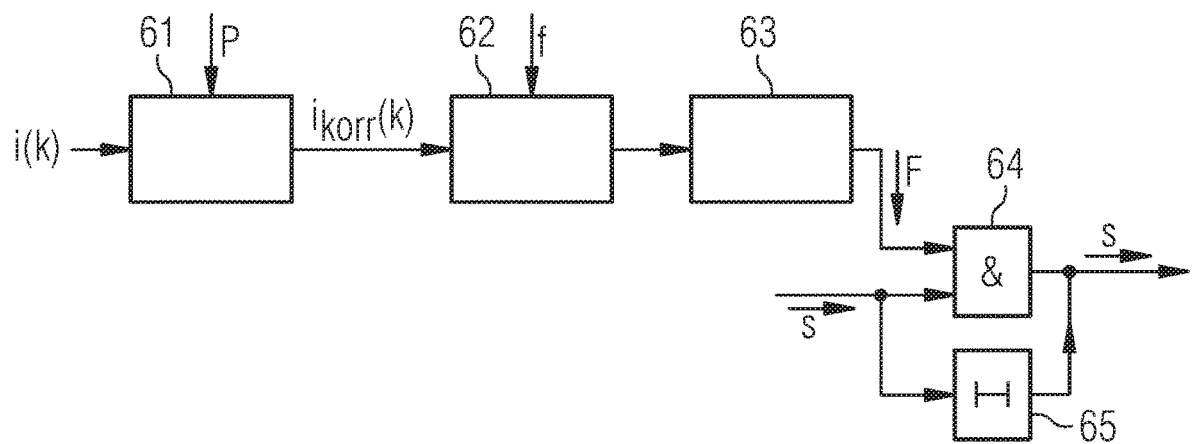
FIG. 6 shows an exemplary flowchart for explaining a method for controlling a circuit breaker.

An exemplary flowchart for carrying out a method for controlling a circuit breaker is illustrated in FIG. 6. Although FIG. 6 shows a plurality of individual blocks for explaining the method, the method can also be implemented in corresponding software programming for a processor. The method is carried out by the apparatus 17 (cf. FIG. 1).

As already explained above with respect to FIG. 1, the essence of the method involves forwarding a switching signal S to the control unit 14 of the circuit breaker 15 only when current zero crossings occur in the current flowing through the circuit breaker 15. For this purpose, the current i(k) output by the current transformer on the secondary side is first of all recorded. In block 61, the current i(k) is corrected by means of an additional filter in such a manner that a DC element present in the primary current is modeled in the secondary current as accurately as possible. For this purpose, the sampled current is sent through a correction filter in order to reconstruct the original DC element corresponding to the primary current. The superimposed sinusoidal component is faithfully transmitted. The filter coefficients of the filter used for correction are determined using input parameters P with regard to the transformer type (for example P, PX, TPZ, etc.) and/or a transformer time constant (for example 1 s, 60 ms). Secondary current values $Ik_{orr}(k)$ corrected by the filter are output on the output side. These are supplied to a block 62.

In block 62, the current is continuously (in the three-phase system for each phase) checked for zero crossings using a measurement method (for example consideration of a change in the sign of the samples). The check is preferably carried out cyclically within a network period since the current may be shifted as a result of the possible DC element shift. The instantaneous network frequency f is required for the purpose of determining the network period. This network frequency is determined using a suitable frequency measurement method and is made available to block 62.

The corrected secondary current $i_{korr}(k)$ is examined for the zero crossings. If zero crossings are found, a release signal F is transmitted in block 63. This release signal F is cyclically determined and renewed.

A switching signal S generated by the computing device 16 (cf. FIG. 1) is forwarded to the control unit 14 when both the switching signal S and the release signal are present on the input side of an AND element 64.

In an optional embodiment, it is also possible to provide a timer 65 to which the switching signal S is likewise applied and which forwards the switching signal to the control unit—independently of the presence of a release signal—when a predefined period has expired. This makes it possible to ensure that the switching signal S in any case results in a switching action at the latest after the expiry of the predefined period.

FIG. 7 illustrates, by way of example, the effect of the correction filter (block 61 in FIG. 6). Curve 71 indicates the primary current having a DC element. Curve 72 shows the (uncorrected) secondary current i(k) of the current transformer, which is supplied to block 61. It is clearly seen that the DC element is suppressed in the uncorrected case. The primary current is reproduced as accurately as possible by the digital correction filter. The corrected current $i_{korr}(k)$ is shown as curve 73 in FIG. 7.

Although the invention has been described and illustrated more specifically in detail above by means of preferred exemplary embodiments, the invention is not restricted by the disclosed examples and other variations can be derived therefrom by a person skilled in the art without departing from the scope of protection of the following patent claims.

The invention claimed is:

1. A method for controlling a circuit breaker in an electrical energy supply network, the method comprising:
generating a switching signal by way of a protective or control device of the energy supply network;
monitoring a current flowing through the circuit breaker and checking the current for an occurrence of zero crossings;
transmitting the switching signal to a control unit of the circuit breaker only after at least one zero crossing has been detected, the switching signal causing the control unit to open switching contacts of the circuit breaker;
using a current transformer to record the current flowing through the circuit breaker, wherein the current transformer has a primary side and a secondary side; and
subjecting a current profile output by the current transformer on the secondary side to a correction in order to model a DC element, contained in a current present on the primary side, on the secondary side;
wherein the control unit, by means of a switch control device, determines, after receipt of the switching signal, an optimal switching time of the circuit breaker and controls a switch drive of the control unit to open the circuit breaker as close as possible to a current zero crossing.

2. The method according to claim 1, which comprises:
monitoring a section of the energy supply network which is limited by the circuit breaker for the occurrence of a fault by the protective or control device; and
generating the switching signal by the protective or control device if a fault is detected with respect to the section.

3. The method according to claim 1, which comprises generating the switching signal by way of the protective or control device upon receiving an external switch-off command.

4. The method according to claim 1, which comprises determining that a zero crossing occurs for each period duration of the current flowing through the circuit breaker when a change in a sign of the current is detected.

5. The method according to claim 1, which comprises:
generating a release signal by way of the protective or control device if at least one zero crossing has been detected with regard to the current flowing through the circuit breaker; and
forwarding the switching signal to the control unit when both the switching signal and the release signal are present.

6. The method according to claim 5, which comprises generating the release signal cyclically for each period duration of the current flowing through the circuit breaker.

7. The method according to claim 6, which comprises determining a frequency of the current flowing through the circuit breaker in order to determine the period duration of the current.

8. The method according to claim 5, which comprises determining a frequency of the current flowing through the circuit breaker in order to determine a period duration of the current.

9. The method according to claim 1, which comprises preventing a forwarding of the switching signal to the control unit until at least a predefined number of zero crossings have been detected.

10. The method according to claim 1, which comprises forwarding the switching signal to the control unit independently of a presence of zero crossings with regard to the current flowing through the circuit breaker if a predefined time period has expired since the generation of the switching signal.

11. The method according to claim 1, which comprises using a digital filter to correct the current profile output by the current transformer on the secondary side, wherein coefficients of the filter are formed on a basis of a current transformer type and/or a time constant of the current transformer.

12. The method according to claim 1, which comprises checking the current flowing through the circuit breaker for the occurrence of zero crossings in the protective or control device.

13. The method according to claim 1, which comprises checking the current flowing through the circuit breaker for the occurrence of zero crossings in an apparatus which is arranged downstream of the protective or control device and is arranged upstream of the circuit breaker, in a signal flow direction.

14. A system with an apparatus for controlling a circuit breaker in an electrical energy supply network and a control unit, the apparatus comprising:
- a signal input for receiving a switching signal generated by a protective or control device of the energy supply network;
- a signal output for outputting a switching signal to a control unit of the circuit breaker;
- the apparatus being configured to check a current flowing through the circuit breaker for the occurrence of zero crossings;
- the apparatus being configured to prevent forwarding of the switching signal to the control unit until at least one zero crossing has been detected;
- the apparatus being configured to use a current transformer to record the current flowing through the circuit breaker, wherein the current transformer has a primary side and a secondary side; and
- the apparatus being configured to subject a current profile output by the current transformer on the secondary side to a correction in order to model a DC element, contained in a current present on the primary side, on the secondary side;
- wherein the control unit includes a switch drive of the circuit breaker, wherein the control unit is configured, by means of the switch control device, to determine after receipt of the switching signal an optimal switching time of the circuit breaker and to control the switch drive accordingly to open the circuit breaker as close as possible to a current zero crossing.

15. The apparatus according to claim 14, wherein the apparatus is integrated in the protective or control device.

16. The apparatus according to claim 14, wherein the apparatus is separate from the protective or control device.

17. A method for controlling a circuit breaker in an electrical energy supply network, the method comprising:
- generating a switching signal by way of a protective or control device of the energy supply network;
- monitoring a current flowing through the circuit breaker and checking the current for an occurrence of zero crossings;
- transmitting the switching signal to a control unit of the circuit breaker only after at least one zero crossing has been detected, the switching signal causing the control unit to open switching contacts of the circuit breaker;
- using a current transformer to record the current flowing through the circuit breaker; and
- subjecting a current profile output by the current transformer on a secondary side to a correction in order to model a DC element, contained in a current present on the primary side, on the secondary side.

18. An apparatus for controlling a circuit breaker in an electrical energy supply network, the apparatus comprising:
- a signal input for receiving a switching signal generated by a protective or control device of the energy supply network;
- a signal output for outputting a switching signal to a control unit of the circuit breaker;
- the apparatus being configured to check a current flowing through the circuit breaker for the occurrence of zero crossings;
- the apparatus being configured to prevent forwarding of the switching signal to the control unit until at least one zero crossing has been detected;
- the apparatus being configured to use a current transformer to record the current flowing through the circuit breaker; and
- the apparatus being configured to subject a current profile output by the current transformer on a secondary side to a correction in order to model a DC element, contained in a current present on the primary side, on the secondary side.

* * * * *